(12) United States Patent
Yanagimoto et al.

(10) Patent No.: US 10,658,939 B2
(45) Date of Patent: May 19, 2020

(54) POWER CONVERSION APPARATUS AND NOISE FILTER

(71) Applicant: KABUSHIKI KAISHA YASKAWA DENKI, Kitakyushu-shi (JP)

(72) Inventors: Tetsuo Yanagimoto, Kitakyushu (JP); Yuki Kawafuchi, Kitakyushu (JP); Makoto Nakaya, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 166 days.

(21) Appl. No.: 15/355,066

(22) Filed: Nov. 18, 2016

(65) Prior Publication Data
US 2017/0149348 A1 May 25, 2017

(30) Foreign Application Priority Data
Nov. 20, 2015 (JP) .................. 2015-228122

(51) Int. Cl.
*H02B 1/20* (2006.01)
*H02B 1/46* (2006.01)
(Continued)

(52) U.S. Cl.
CPC ............. *H02M 7/003* (2013.01); *H02B 1/20* (2013.01); *H02B 1/46* (2013.01); *H02M 7/04* (2013.01);
(Continued)

(58) Field of Classification Search
CPC .......... H02M 7/003; H02M 7/04; H02M 7/00; H02B 1/20; H02B 1/46; H03H 1/007; H03H 2001/0035; H03H 1/00; B60K 6/445; B60K 6/52; B60L 3/003; B60L 3/0069; H01F 27/2852; H01F 27/306; H01F 37/00;
(Continued)

(56) References Cited

U.S. PATENT DOCUMENTS

| 2002/0057582 A1* | 5/2002 | Nakayama | ............. B60K 6/445 363/17 |
| 2010/0085778 A1* | 4/2010 | Saito | ..................... H01F 17/041 363/20 |

(Continued)

FOREIGN PATENT DOCUMENTS

| GB | 2129622 A * | 5/1984 | ........... H01F 27/263 |
| JP | 2005-093536 | 4/2005 | |

(Continued)

OTHER PUBLICATIONS

Japanese Office Action for corresponding JP Application No. 2015-228122, dated Mar. 28, 2017 (w/ English machine translation).
(Continued)

*Primary Examiner* — Timothy J Thompson
*Assistant Examiner* — Guillermo J Egoavil
(74) *Attorney, Agent, or Firm* — Mori & Ward, LLP

(57) ABSTRACT

A power conversion apparatus includes: a busbar; a magnetic core disposed to surround the busbar; and a fixing member that supports the magnetic core and is secured to the busbar. A noise filter includes: a magnetic core disposed to surround a busbar of a power conversion apparatus, and a fixing member that supports the magnetic core and is secured to the busbar.

16 Claims, 11 Drawing Sheets

(51) Int. Cl.
*H02M 7/00* (2006.01)
*H02M 7/04* (2006.01)
*H03H 1/00* (2006.01)

(52) U.S. Cl.
CPC ... *H03H 1/0007* (2013.01); *H03H 2001/0035* (2013.01)

(58) Field of Classification Search
CPC .......... H01R 4/34; H01R 4/64; H01R 13/405; H01R 31/085; H05K 7/1432; G01R 33/02; G01R 33/07; G01R 33/09
USPC .................. 361/807, 809, 810; 174/72 A
See application file for complete search history.

(56) References Cited

U.S. PATENT DOCUMENTS

| | | | | |
|---|---|---|---|---|
| 2013/0285786 A1* | 10/2013 | Hu | ............................ | H01F 3/12 336/220 |
| 2014/0077797 A1* | 3/2014 | Nagao | .................... | G01R 19/15 324/253 |
| 2014/0184212 A1* | 7/2014 | Yamaguchi | .......... | G01R 15/207 324/244 |
| 2015/0042324 A1* | 2/2015 | Fujita | ................. | G01R 19/0092 324/244 |
| 2015/0208534 A1* | 7/2015 | Ikezawa | ............. | H01F 27/2852 174/520 |
| 2015/0288082 A1* | 10/2015 | Miyawaki | ................ | H01R 4/34 439/810 |

FOREIGN PATENT DOCUMENTS

| | | | | |
|---|---|---|---|---|
| JP | 2005093536 A | * | 4/2005 | ............ H01F 27/26 |
| JP | 2008-192666 | | 8/2008 | |
| JP | 2008275566 A | * | 11/2008 | |

OTHER PUBLICATIONS

Chinese Office Action for corresponding CN Application No. 201610941280.5, dated Jul. 27, 2018 (w/ machine translation).
Chinese Office Action for corresponding CN Application No. 201610941280.5, dated Feb. 20, 2019 (w/ machine translation).

* cited by examiner

POWER CONVERSION APPARATUS AND NOISE FILTER

CROSS-REFERENCE TO RELATED APPLICATION

This application claims priority from Japanese Patent Application No. 2015-228122 filed with the Japan Patent Office on Nov. 20, 2015, the entire content of which is hereby incorporated by reference.

BACKGROUND

1. Technical Field

This disclosure relates to a power conversion apparatus and a noise filter.

2. Description of the Related Art

Japanese Unexamined Patent Application Publication No. 2008-192666 discloses a noise absorbing device with a magnetic core that a cable passes through.

SUMMARY

A power conversion apparatus includes: a busbar; a magnetic core disposed to surround the busbar; and a fixing member that supports the magnetic core and is secured to the busbar.

DESCRIPTION OF THE EMBODIMENTS

Figure 1:
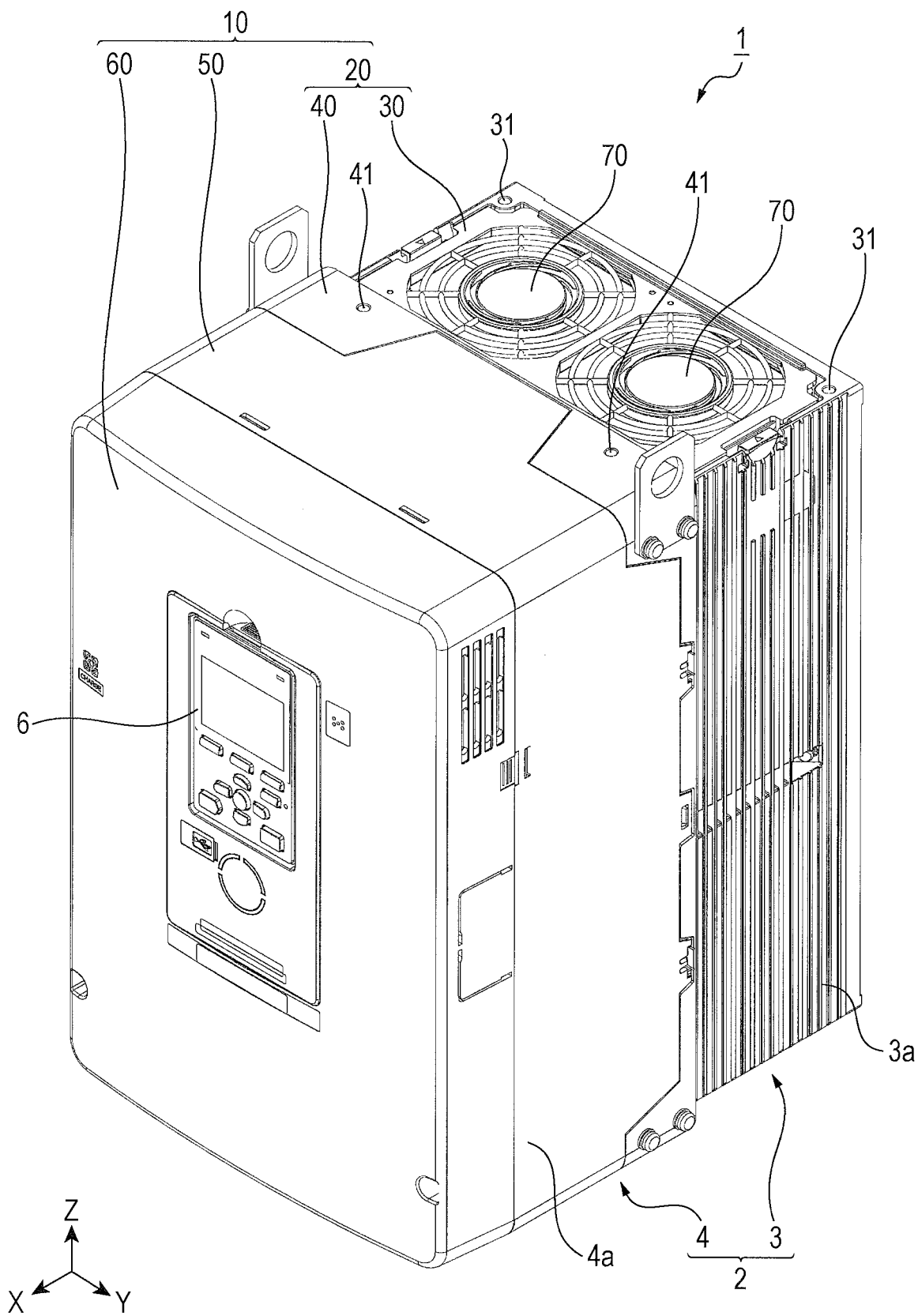
FIG. 1 is a perspective view illustrating a power conversion apparatus.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A power conversion apparatus according to an embodiment of the present disclosure includes: a busbar; a magnetic core disposed to surround the busbar; and a fixing member that supports the magnetic core and is secured to the busbar.

A noise filter according to an embodiment of the present disclosure includes: a magnetic core disposed to surround a busbar of a power conversion apparatus, and a fixing member that supports the magnetic core and is secured to the busbar.

According to the above-described aspect of this disclosure, a power conversion apparatus and a noise filter configured to position a magnetic core on a more effective position for a noise reduction can be provided.

The following describes an embodiment in detail with reference to the drawings. In the following description, like reference numerals designate identical elements or elements with identical functions, and therefore redundant descriptions are omitted.

A power conversion apparatus 1 according to this embodiment converts an AC power (such as a commercial three-phase AC power) or a DC power into an AC power (such as a three-phase AC power) with a desired frequency to output. The power conversion apparatus 1 is used for a control system of industrial equipment for example.

1. Overall Configuration of Power Conversion Apparatus

Figure 2:
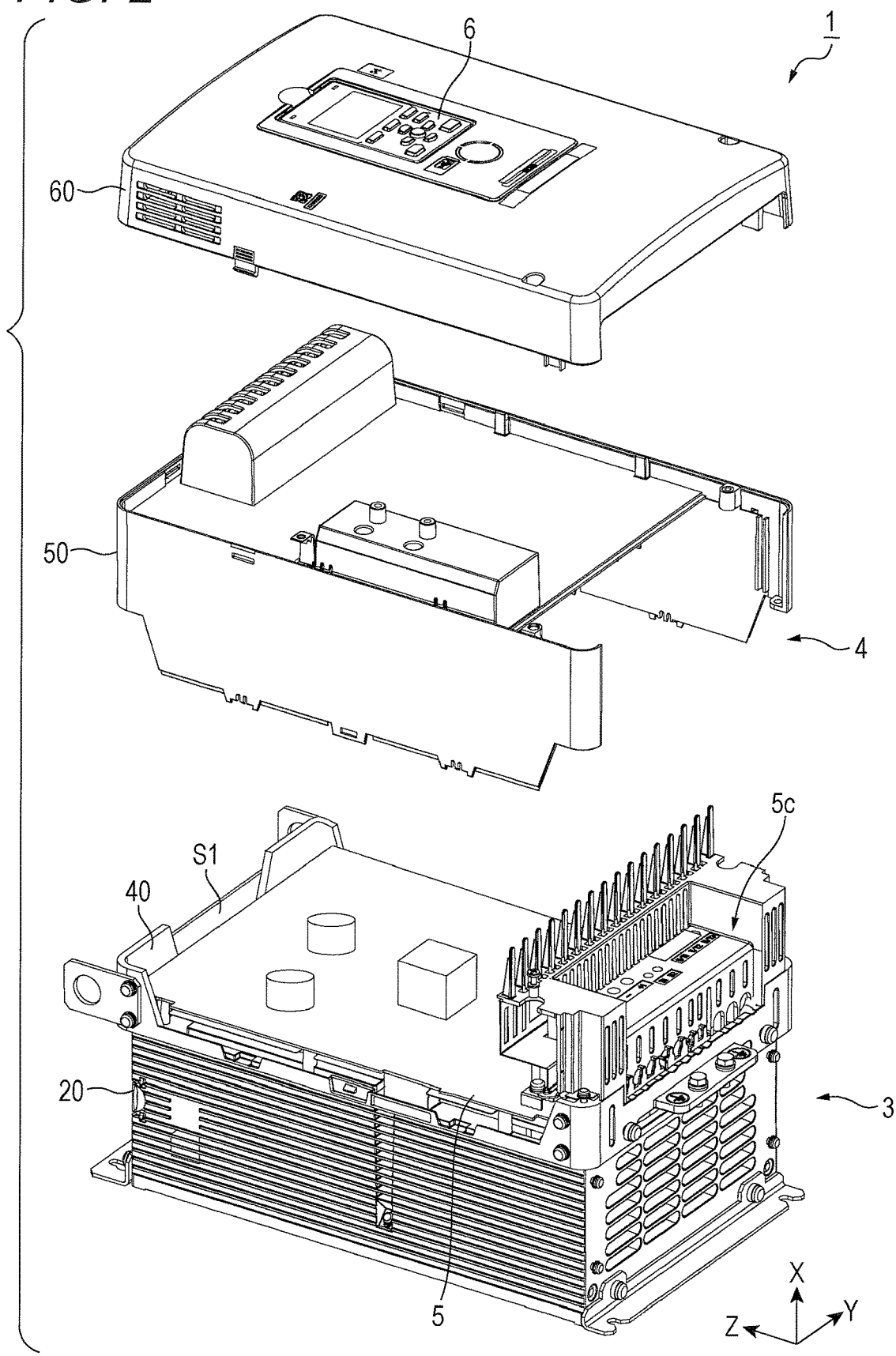
FIG. 2 is an exploded perspective view illustrating the power conversion apparatus.

First, a specific configuration of the power conversion apparatus 1 will be described with reference to FIGS. 1 to 3. In the following description, "up and down" means up and down in a typical installation state. "Front, back, right, and left" mean directions in a case where an operation panel (described below) side is a front side and an opposite side of the operation panel side is a back side. In illustrations, a Z-axis positive direction indicates upper, and an X-axis positive direction indicates front.

The power conversion apparatus 1 includes a main body 2 that includes a circuit board 5 for electric power conversion. The main body 2 may include a first main body part 3 and a second main body part 4 adjacent to one another. The circuit board 5 may be housed in the second main body part 4. The first main body part 3 may be used for cooling a circuit element of the circuit board 5.

More specifically, the main body 2 includes a housing 10. The housing 10 includes a first space S1 and a second space S2 inside. The first space S1 includes the circuit board 5. The second space S2 includes a flow passage FP1 for a fluid for cooling. For example, as illustrated in FIG. 2, the housing 10 includes a base housing 20, a first cover 50, and a second cover 60.

The base housing 20 includes a first base part 30 opened backward and a second base part 40 opened forward. A partition wall 21 partitions between the first base part 30 and the second base part 40 (see FIG. 3). The second base part 40 includes the circuit board 5 facing the partition wall 21. The circuit board 5 includes a lower part where a terminal 5c, to which electric wires for input and output are connected, is disposed.

The first cover 50 is installed on the second base part 40 from the front. The first cover 50 covers the circuit board 5 in a state where the terminal 5c is opened. The first cover 50 forms the first space S1 collaborating with the second base part 40.

The second cover 60 is installed on the first cover 50 from the front to cover the first cover 50 and the terminal 5c. The second main body part 4 of the main body 2 includes the second base part 40, the first cover 50, and the second cover 60. The second cover 60 includes a front face used as the operation panel. For example, the front face of the second cover 60 includes an operator 6.

The operator 6 accepts an input by a user of the power conversion apparatus 1 and indicates internal information of the power conversion apparatus 1. The operator 6 may be removable with respect to the front face of the second cover 60.

Figure 3:
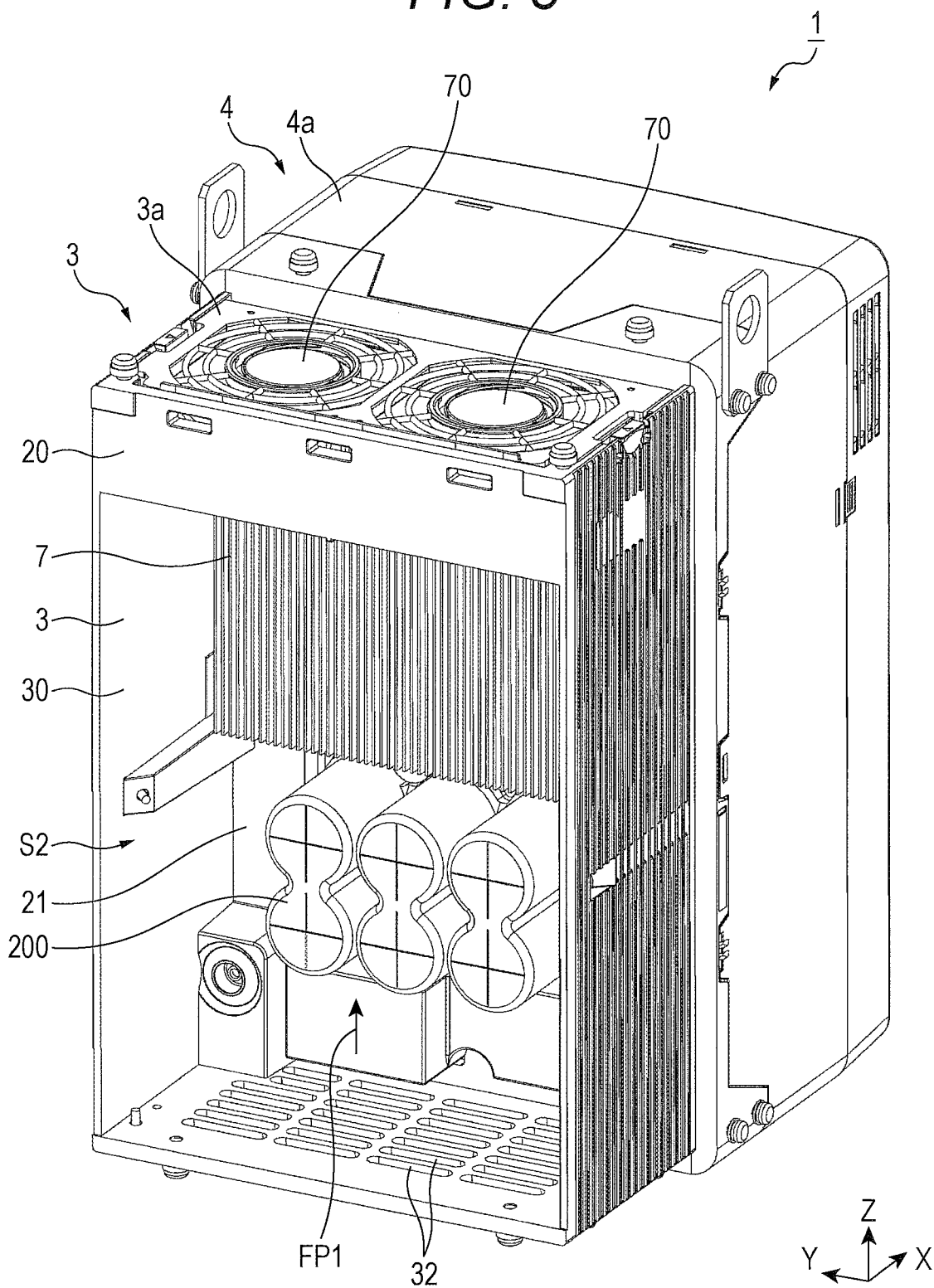
FIG. 3 is a perspective view illustrating the power conversion apparatus viewed from another direction.

As illustrated in FIG. 3, the first base part 30 internally includes the second space S2. The partition wall 21 partitions between the first space S1 and the second space S2. When the partition wall 21 includes an opening, the opening belongs to the second space S2. That is, the front face of the partition wall 21 is a boundary of the first space S1 and the second space S2.

The above-described flow passage FP1 is configured as follows for example. The first base part 30 includes the lower part where air holes 32 are disposed. The first base part 30 includes the upper part where at least one fan 70 (such as two) is installed. Blowing air upward or downward by the fan 70 generates an airflow along an up and down direction in the second space S2. The air generating the airflow is an example of the above-described fluid for cooling. A flow passage of the air is an exemplary flow passage FP1. The first main body part 3 of the main body 2 includes the first base part 30.

The first main body part 3 may include a cooling fin 7. For example, the cooling fin 7 radiates a heat occurred from the circuit element (such as a switching element) of the circuit board 5. The cooling fin 7 may be disposed on the flow passage FP1 in the second space S2 inside the first base part 30.

2. Noise Filter
(1) Busbar

As illustrated in FIGS. 4 to 9, the power conversion apparatus 1 may include at least one busbar 310. The busbar 310 is a plate-shaped or rod-shaped conductor. For ensuring a sufficient conductive property, the busbar 310 has a cross section with a size where it is difficult for the busbar 310 to be deformed insofar as an intentional stress for processing is not applied.

The busbar 310 is used for transmitting an input power and an output power or the like in the main body 2. For example, the busbar 310 may couple a rectifier circuit on the circuit board 5 to the terminal 5c of the circuit board 5. In this case, one end of the busbar 310 is secured to an input terminal of the rectifier circuit on the circuit board 5. Another end of the busbar 310 is secured to a terminal electrically conductive to an input port of the terminal 5c. The busbar 310 may couple a switching circuit on the circuit board 5 to the terminal 5c of the circuit board 5. In this case, one end of the busbar 310 is secured to an output terminal of the switching circuit on the circuit board 5. Another end of the busbar 310 is secured to a terminal electrically conductive to an output port of the terminal 5c. When the power conversion apparatus 1 includes a plurality of the circuit boards 5, the busbar 310 may couple the circuit boards 5 one another. In this case, one end of the busbar 310 is secured to a terminal of one circuit board 5. Another end of the busbar 310 is secured to a terminal of another circuit board 5. In the busbar 310, an opening or a protrusion for positioning a noise filter 320 described below may be formed.

(2) Noise Filter

The power conversion apparatus 1 may include the noise filter 320. The noise filter 320 restrains a noise caused by the electric power transmitted by the busbar 310. The noise filter 320 includes a magnetic core 321 and a core holding member (fixing member) 322.

The magnetic core 321 is arranged to surround the busbar 310. The magnetic core 321 is, for example, a circular ferrite core. The magnetic core 321 restrains a rapid fluctuation in an electric current passing through the busbar 310 to restrain the noise emitted from the busbar 310. The "circular" means merely to be closed in a circumferential direction surrounding the busbar 310. Accordingly, the shape of the circular magnetic core 321 is not limited to an annular shape. The magnetic core 321 may be an elliptical ring shape, an oval-shaped ring shape, or a polygonal ring shape.

The core holding member 322 supports the magnetic core 321 and is secured to the busbar 310. That is, the core holding member 322 functions as a means for securing the magnetic core 321 to the busbar 310. The core holding member 322 may be positioned corresponding to the opening or the protrusion of the busbar 310 for positioning the noise filter 320 (the core holding member 322). The following describes a specific exemplary configuration of the core holding member 322.

Figure 4:
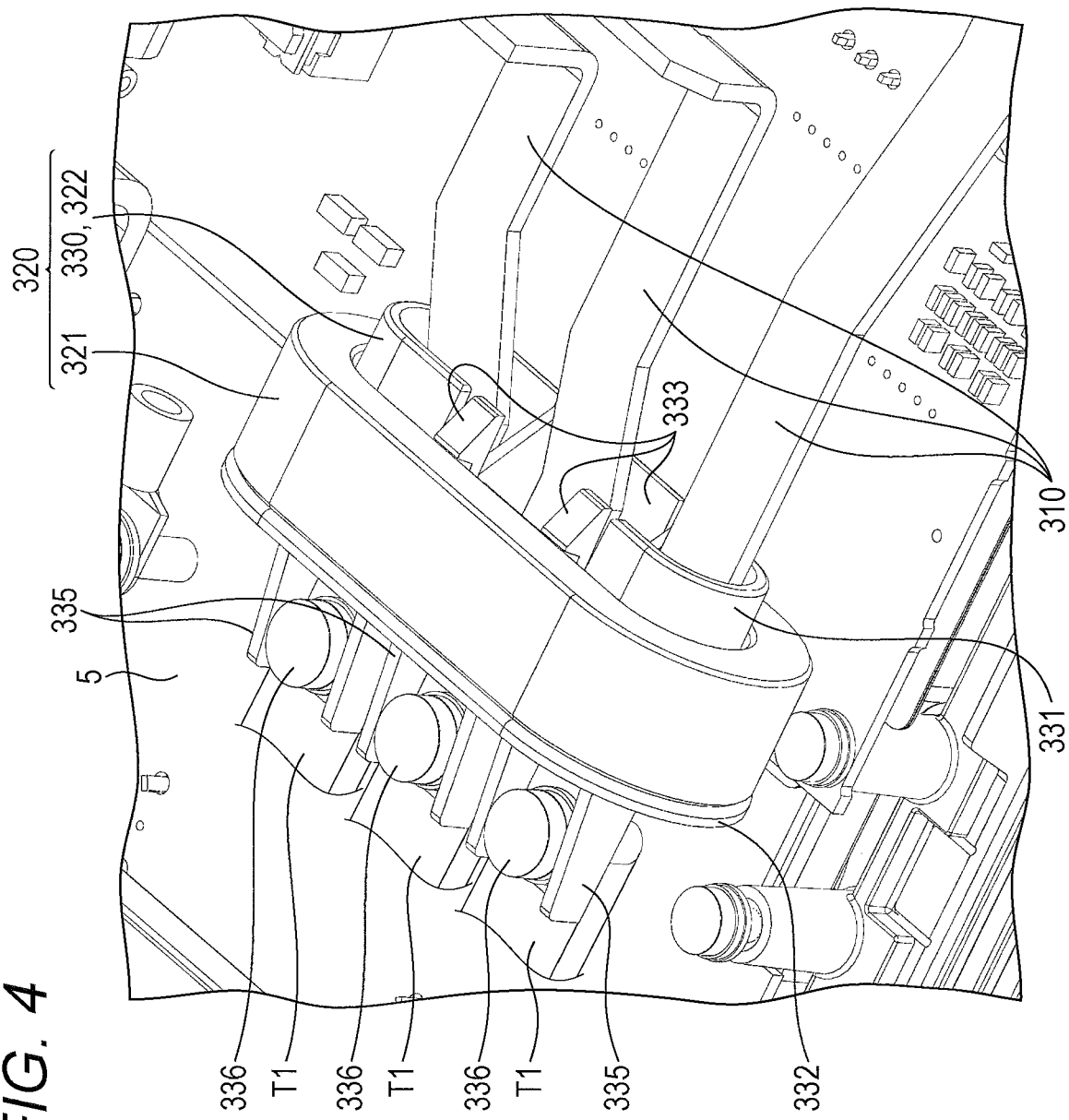
FIG. 4 is a perspective view illustrating a noise filter.
Figure 5:
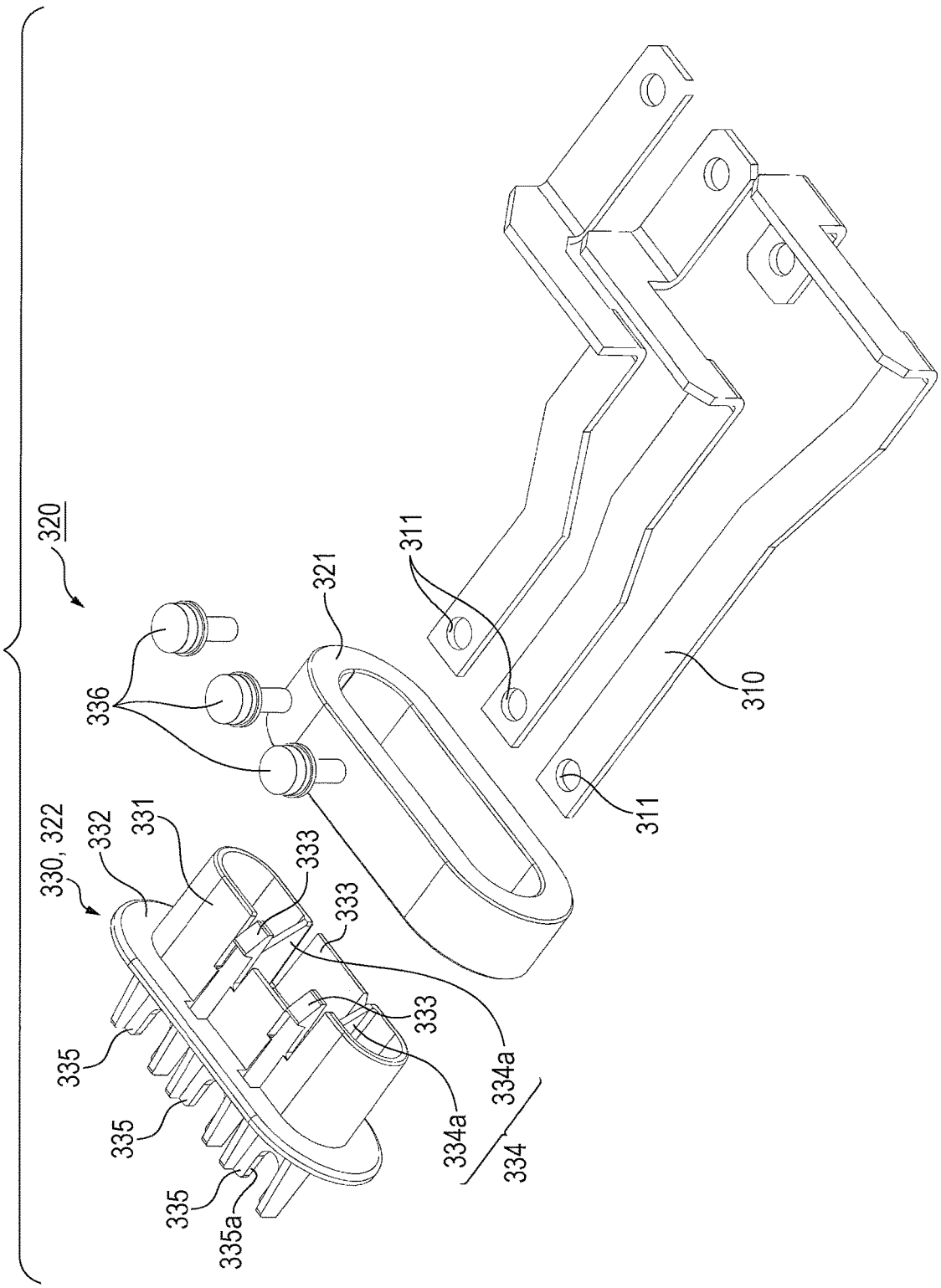
FIG. 5 is an exploded perspective view illustrating the noise filter in FIG. 4.

The core holding member 322 may be configured to be fastened to a terminal for securing the busbar 310 along with the busbar 310. As an exemplary core holding member 322 according to the configuration, FIGS. 4 and 5 illustrate a core holding member 330. The core holding member 330 is fastened to a terminal T1 for securing the busbar 310 along with the busbar 310.

As illustrated in FIG. 5, the above-described opening or protrusion of the busbar 310 for positioning the noise filter 320 (the core holding member 330) may include a first opening 311. The first opening 311 is formed on an end of the busbar 310 for example. Through the first opening 311, a fastening member 336 for securing the end of the busbar 310 to the terminal T1 passes. The fastening member 336 is, for example, a screw.

In the example illustrated in the drawings, the magnetic core 321 is installed on three busbars 310 for outputting a three-phase AC. The magnetic core 321 has the oval-shaped ring shape for surrounding the plate-shaped three busbars 310 arranged in a width direction.

The core holding member 330 is secured to the terminal T1 along with the busbar 310 by the fastening member 336. This positions the core holding member 330 with respect to the first opening 311. More specifically, the core holding member 330 includes a holder 331, a flange 332, and a plurality of (such as three positions) extending portions 335. The holder 331 is a cylindrical body and restrains the magnetic core 321 from an inner peripheral side. The holder 331 has a cross-sectional shape in an oval-shape corresponding to a shape of the magnetic core 321.

The flange 332 is disposed on one end of the holder 331 to project out to an outer periphery of the holder 331. The three extending portions 335 are arranged in a direction where the cross-sectional shape of the holder 331 extends, and project from the flange 332 to an opposite side of the holder 331.

On the three extending portions 335, each end of the three busbars 310, which are inserted into the holder 331 from the holder 331 side of the flange 332, overlaps. In the respective extending portions 335, an opening 335a corresponding to the first opening 311 is formed. The opening 335a passes through the extending portion 335. The opening 335a may be opened to the holder 331 side on the flange 332.

In a state where the end of the busbar 310 overlaps the extending portion 335, the fastening member 336 is passed through the first opening 311 and the opening 335a to be fastened to the terminal T1. This secures the core holding member 330 to the busbar 310 in a state where the core holding member 330 is positioned with respect to the first opening 311.

The core holding member 330 may include at least one stop 333 that restrains the magnetic core 321 from removed from the holder 331. The illustrated core holding member 330 include three stops 333.

The core holding member 330 may further include a separator 334. The separator 334 is disposed on an inner peripheral side of the magnetic core 321 to keep the plurality of busbars 310 in a state of being apart from one another. For example, the separator 334 includes a plurality of partition walls 334a disposed in the holder 331. The plurality of partition walls 334a partition the inside of the holder 331 into a plurality of slots. The plurality of busbars 310 are inserted into the plurality of slots one by one. The holder 331 may be configured to restrain the magnetic core 321 from the outer peripheral side.

The core holding member 322 may be removable in a direction intersecting with the busbar 310. Removing the core holding member 322 means to remove the core holding member 322 from the peripheral area of the busbar 310.

Figure 6:
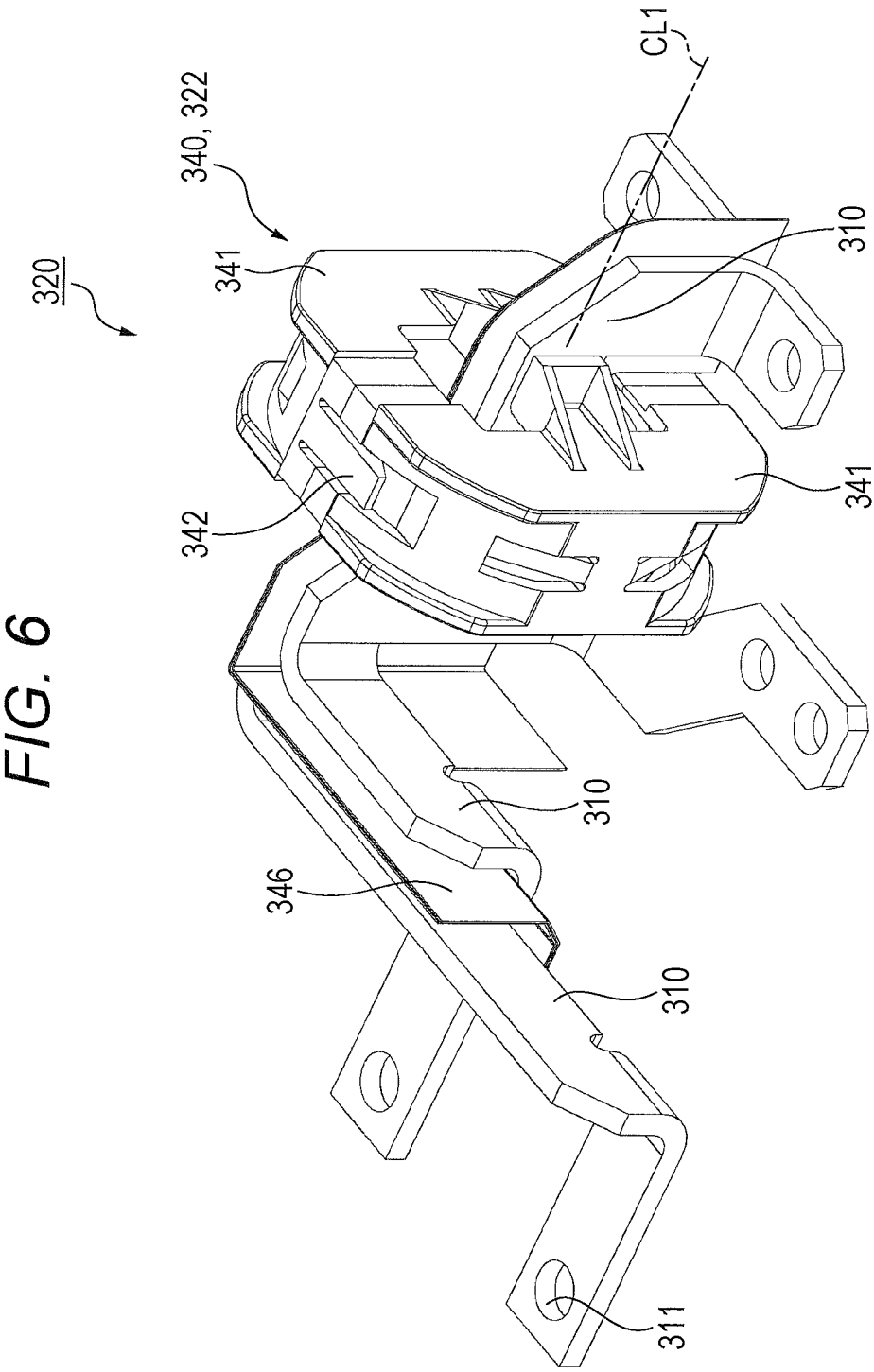
FIG. 6 is a perspective view illustrating a modification of the noise filter.
Figure 7:
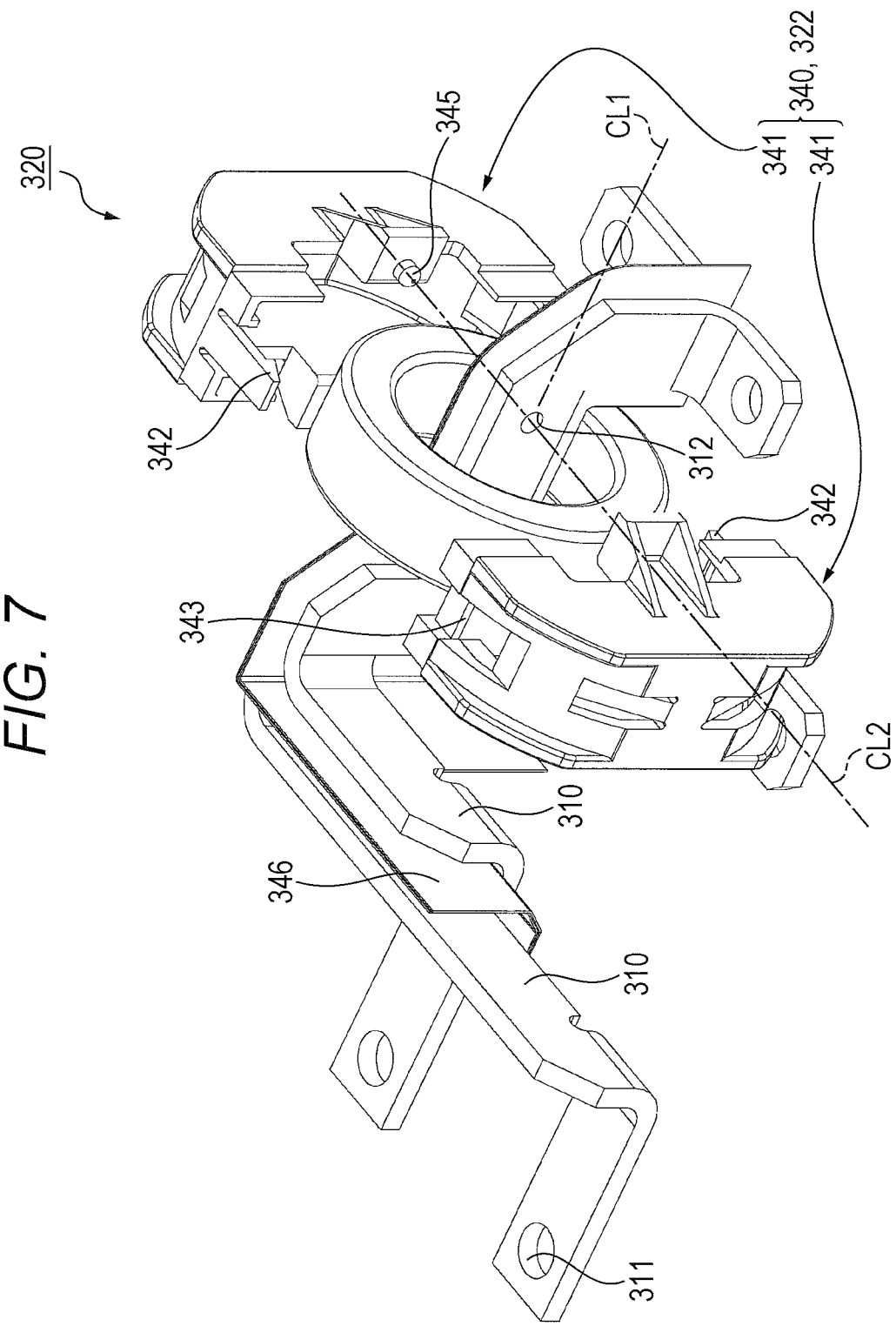
FIG. 7 is an exploded perspective view illustrating the noise filter in FIG. 6.

As an example of the core holding member 322 removable in the direction intersecting with the busbar 310, FIGS. 6 and 7 illustrate a core holding member 340. The core holding member 340 is dividable into a plurality of (such as two) parts 341 arranged in the direction intersecting with the busbar 310 (direction intersecting with an illustrated axis line CL1). The respective parts 341 have a semi-annular shape to restrain the magnetic core 321 from the outer peripheral side. The two parts 341 form an annular shape in a state of being combined with one another to surround the busbar 310 over the whole circumference. When the two parts 341 are separated one another, the state of surrounding the busbar 310 is released. The separated two parts 341 are allowed to be removed in the direction intersecting with the busbar 310. The two parts 341 may have a shape identical to one another. The two parts 341 may be disposed so as to be in a point symmetry to one another viewing from a direction along the busbar 310 (direction along the illustrated axis line CL1).

The part 341 includes one end, in the circumferential direction surrounding the busbar 310, where a stop 342 is disposed, and includes another end where a depressed portion 343 corresponding to the stop 342 is disposed. Disposing the two parts 341 in the point symmetry causes the stop 342 of the one part 341 and the depressed portion 343 of the other part 341 to be arranged on the identical side. Hooking the stop 342 of the one part 341 on the depressed portion 343 of the other part 341 couples the two parts 341 to one another.

The opening or the protrusion of the busbar 310 for positioning the noise filter 320 (the core holding member 340) may include a second opening 312. The second opening 312 may be formed on a position apart from both ends of the busbar 310 compared with the first opening 311 for fastening the end of the busbar 310 to the terminal. The two parts 341 may be arranged in an opening direction of the second opening 312 (direction along an illustrated axis line CL2). At least one of the two parts 341 may include a protrusion 345 fitting to the second opening 312.

Figure 8:
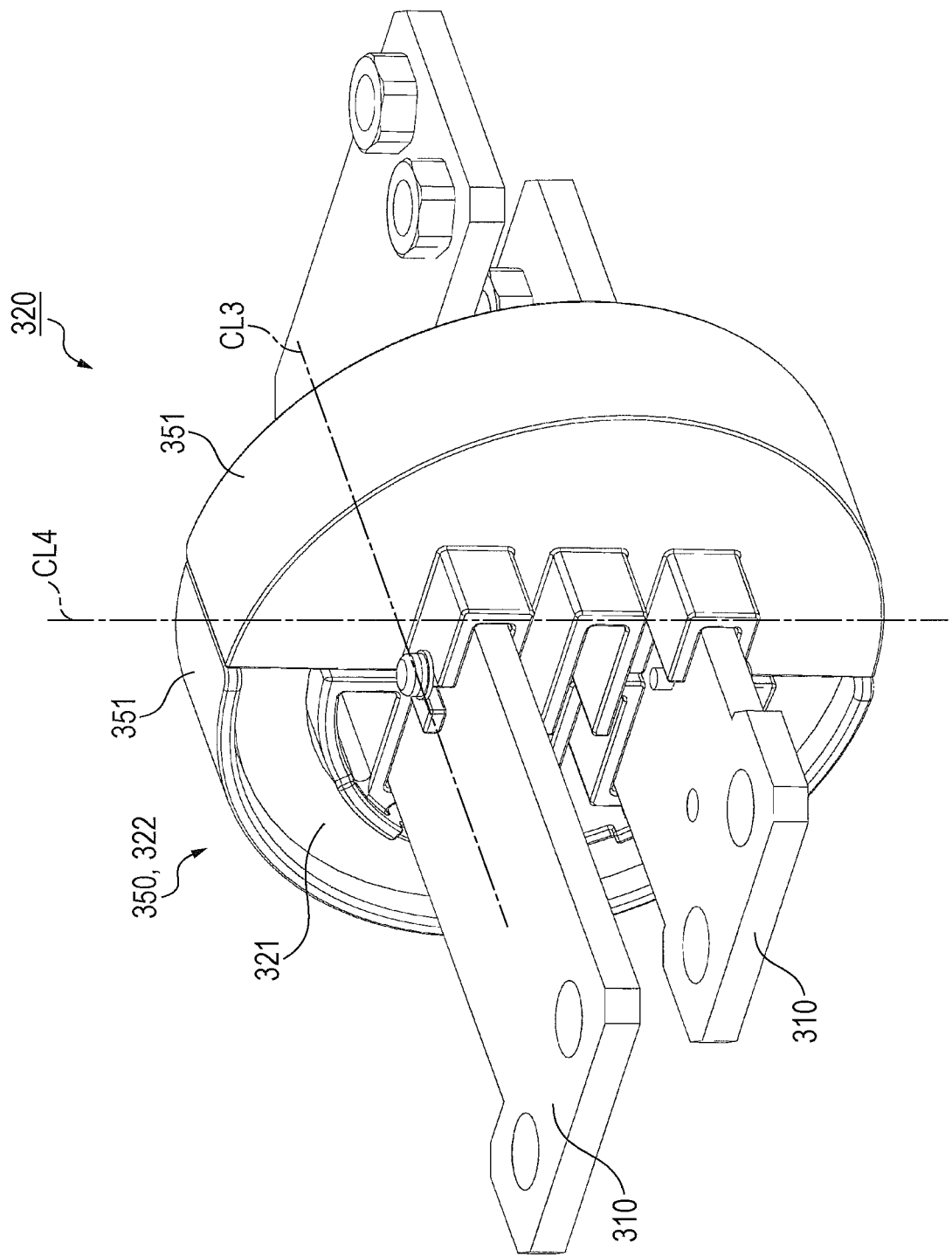
FIG. 8 is a perspective view illustrating another modification of the noise filter.
Figure 9:
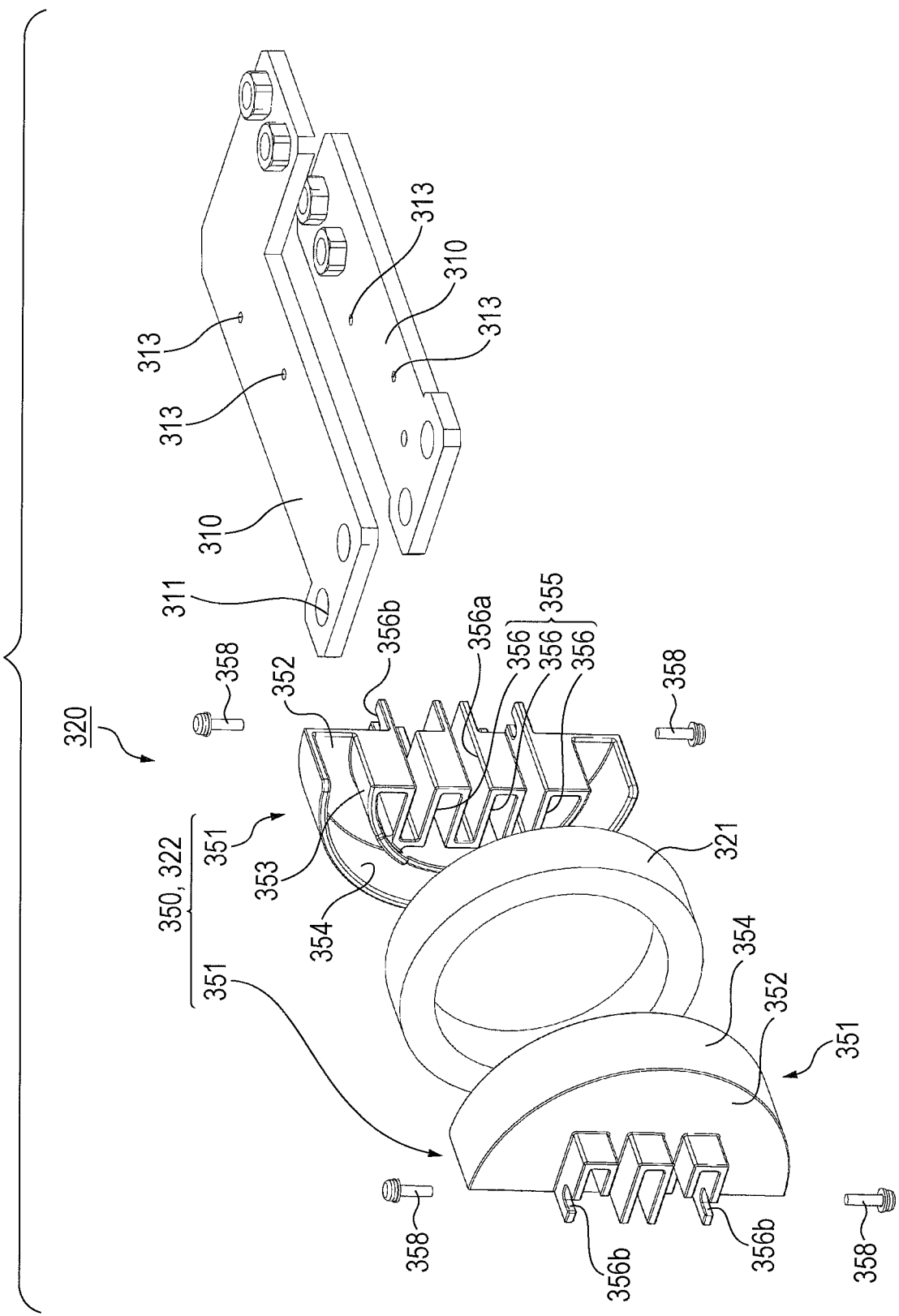
FIG. 9 is an exploded perspective view illustrating the noise filter in FIG. 8.

As another example of the core holding member 322 removable in the direction intersecting with the busbar 310, FIGS. 8 and 9 illustrate a core holding member 350. The core holding member 350 is dividable into a plurality of (such as two) parts 351 arranged in the direction along the busbar 310 (direction along an illustrated axis line CL3). In the example illustrated in the drawings, the magnetic core 321 surrounds two or three plate-shaped busbars 310 arranged in a thickness direction.

The two parts 351 form an annular shape in a state of being combined with one another to surround the busbar 310 over the whole circumference. When the two parts 351 are separated one another in the direction along the busbar 310, the state of surrounding the busbar 310 is released. The separated two parts 351 are allowed to be removed in the direction intersecting with the busbar 310. Thus, the core holding member 350 is dividable into the plurality of parts 351 arranged in the direction along the busbar 310. In this case, a direction where the part 351 is installed on the magnetic core 321 is also along the busbar 310. That is, the part 351 is installed on the magnetic core 321 from the opening direction of the magnetic core 321. This ensures disposing at least a part of the part 351 on both the inner periphery and the outer periphery of the magnetic core 321.

Specifically, the respective parts 351 include an inner holder 353, an outer holder 354, and a flange 352. The inner holder 353 is a semi-cylindrical body and restrains the magnetic core 321 from the inside. The outer holder 354 is also a semi-cylindrical body and restrains the magnetic core 321 from the outside. The flange 352 is disposed on one end side of the inner holder 353 and the outer holder 354 and covers between the inner holder 353 and the outer holder 354.

The two parts 351 may have a shape identical to one another. The two parts 351 may be disposed so as to be in a point symmetry to one another viewing from the direction intersecting with the busbar 310 (direction along an illustrated axis line CL4). Disposing the two parts 351 as described above causes the inner holders 353 of the respective parts 351 to be combined with one another to form a cylindrical shape in the magnetic core 321. Furthermore, the outer holders 354 of the respective parts 351 are combined with one another to form a cylindrical shape in the outside of the magnetic core 321. This restrains the magnetic core 321 from the inner peripheral side and the outer peripheral side. Furthermore, the magnetic core 321 is held between the flanges 352 of the respective parts 351 in the direction along the busbar 310.

The opening or the protrusion of the busbar 310 for positioning the noise filter 320 (the core holding member 350) may include a third opening 313. The third opening 313 may be formed on a position apart from both ends of the busbar 310 compared with the first opening 311 for fastening the end of the busbar 310 to the terminal. The third opening 313 may be disposed on two positions corresponding to the respective two parts 351.

The core holding member 350 may further include a separator 355. The separator 355 is disposed on the inner peripheral side of the magnetic core 321 to keep the plurality of busbars apart from one another. For example, the separator 355 includes a plurality of (such as three) guides 356 disposed inside the inner holder 353. The plurality of guides 356 are arranged in the thickness direction of the busbar 310 and the respective guides 356 extend along the busbar 310. The guide 356 includes a slot 356a for housing the busbar 310. The slot 356a is opened to an opposite side of the inner holder 353. As described above, combining the two parts 351 with one another causes the guides 356 to face one another to restrain the busbar 310 in the slot 356a.

The core holding member 350 may be secured to the busbar 310 and positioned with respect to the third opening 313 by a fastening member 358 inserted into the third opening 313. The fastening member 358 is, for example, a screw.

For one example, the guide 356 of the part 351 extends to the opposite side of the inner holder 353 on the flange 352 from the flange 352. On the opposite side of the inner holder 353 on the flange 352, an opening 356b corresponding to the third opening 313 is formed in the guide 356. The opening 356b passes through the guide 356. The opening 356b may be opened to the inner holder 353 side on the flange 352. The fastening member 358 is passed through the opening 356b to be screwed into the third opening 313. This secures the respective parts 351 to the busbar 310 to be positioned with respect to the third opening 313.

The core holding member 350 may be configured so as not to restrain the magnetic core 321 from the outer peripheral side.

The configuration of the core holding member 322 to be removable in the direction intersecting with the busbar 310 is not necessarily limited to a configuration to be divided into a plurality of parts. Cutting out a part of the circular core holding member 322 allows the core holding member 322 to be removed in the direction intersecting with the busbar 310.

Figure 10:
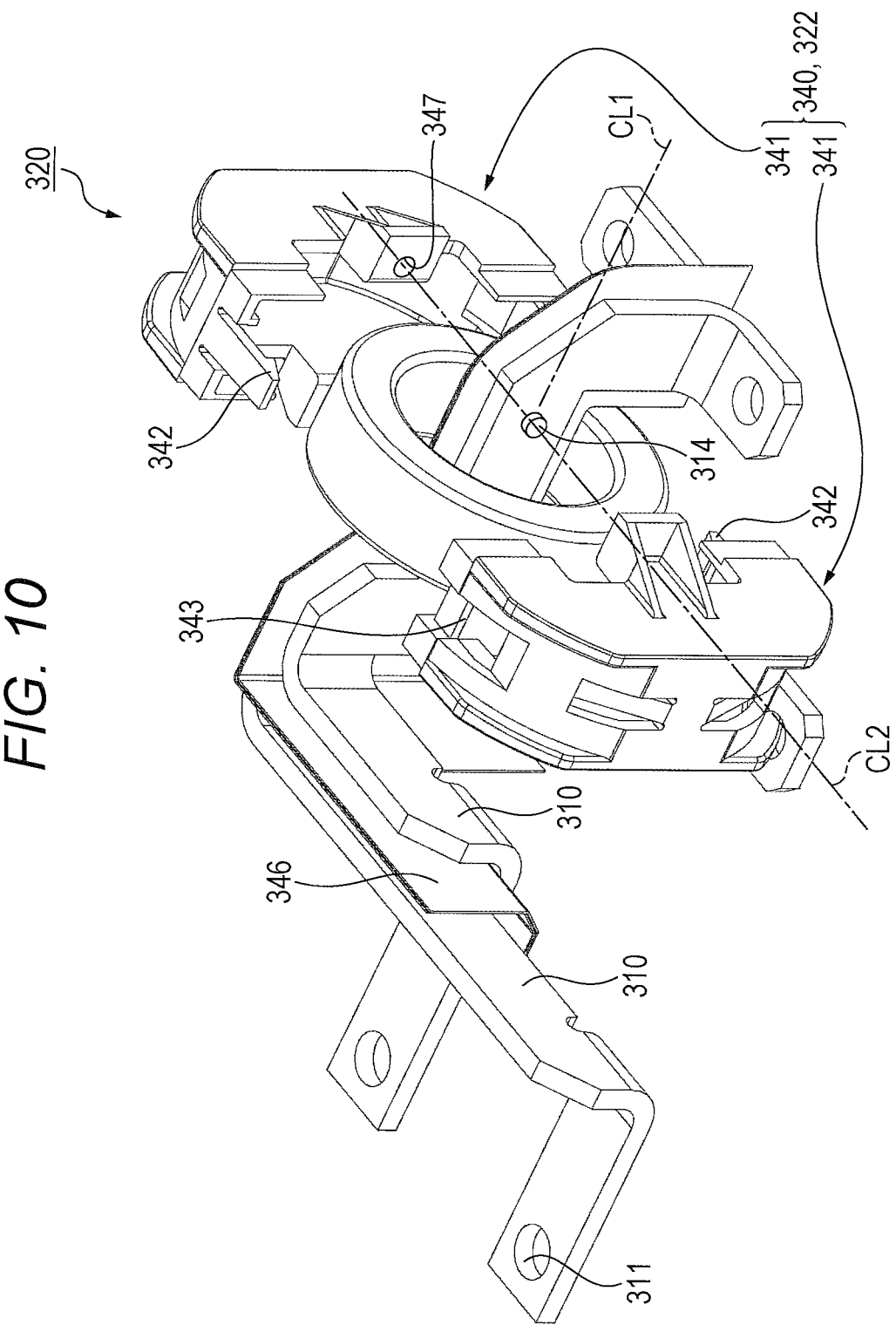
FIG. 10 is an exploded perspective view illustrating a modification of the noise filter.
Figure 11:
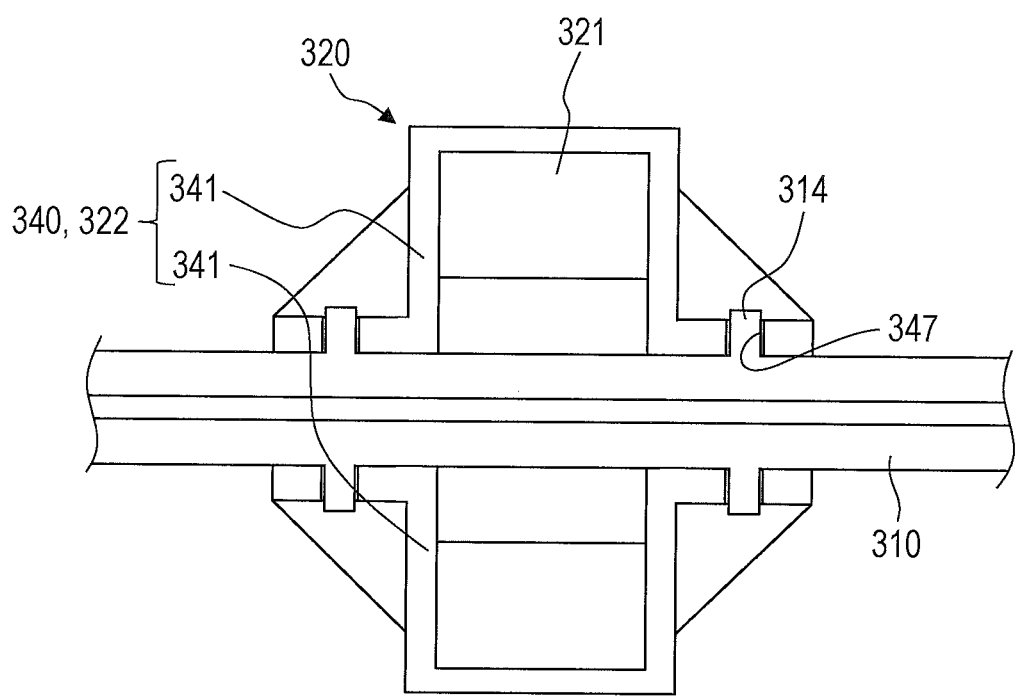
FIG. 11 illustrates the vicinity of a protrusion provided on a busbar in the modification illustrated in FIG. 10.

Elements for positioning the core holding member 322 are not necessarily a through hole such as openings 311, 312 and 313, and may be a depressed portion or a groove with the bottom. The busbar 310 may include a protrusion, and the core holding member 322 may be positioned with respect to the protrusion. For example, as illustrated in FIGS. 10 and 11, a protrusion 314 may be provided on the busbar 310 instead of the opening 312, and an opening 347 may be formed on the core holding member 322 instead of the protrusion 345 in the configuration illustrated in FIGS. 6 and 7. In this case, the core holding member 322 may be positioned by fitting the protrusion 314 into the opening 347. The protrusion of the busbar 310 can be formed by cutting out a rod-shaped member, for example. The protrusion of the busbar 310 can be formed also by bending a plate-shaped member.

The above-described plurality of kinds of core holding members 322 can be used together. For example, the magnetic core 321 may include a first magnetic core 321 and a second magnetic core 321. Furthermore, the core holding member 322 may include a first core holding member (first fixing member) 322 and a second core holding member (second fixing member) 322 respectively corresponding to the first magnetic core 321 and the second magnetic core 321. For example, the first magnetic core 321 is disposed adjacent to the end of the busbar 310, and the second magnetic core 321 is disposed on a position apart from the ends of the busbar 310 compared with the first magnetic core 321.

The first core holding member 322 may be fastened to the terminal T1 for securing the busbar 310 along with the busbar 310 as indicated as the core holding member 330, for example. The second core holding member 322 may be removable from the busbar 310 in the direction intersecting with the busbar 310 as indicated as the core holding members 340 and 350, for example.

3. Advantageous Effects of this Embodiment

As described above, the power conversion apparatus 1 includes the busbar 310, the magnetic core 321 disposed to surround the busbar 310, and the core holding member 322 that supports the magnetic core 321 and is secured to the busbar 310.

The power conversion apparatus 1 uses the core holding member 322 to secure the magnetic core 321 to the busbar 310. Disposing the magnetic core 321 on the peripheral area of the busbar 310 where a high electric current flows is expected to ensure the more effective noise reduction.

In the busbar 310, openings 311 to 313 or a protrusion may be formed. The core holding member 322 may be positioned with respect to the openings 311 to 313 or the protrusion. In this case, the openings 311 to 313 or the protrusion cause the magnetic core 321 to be arranged on a fixed position. This ensures stabilizing the filtering performance of the magnetic core 321 more.

The core holding member 322 may be fastened to the terminal T1 for securing the busbar 310 along with the busbar 310. In this case, using a member (such as a bolt) for fastening the busbar 310 also to secure the core holding member 322 ensures the reduction of a number of the parts of the power conversion apparatus 1 and the simplification of the assembling process.

The openings 311 to 313 or the protrusion of the busbar 310 may include the first opening 311 through which the fastening member 336 for securing the busbar 310 to the terminal T1 passes. Furthermore, the core holding member 322 may be secured to the terminal T1 along with the busbar 310 and positioned with respect to the first opening 311 by the fastening member 336. In this case, the magnetic core 321 can be positioned and secured with more certainty.

The core holding member 322 may be removable from the busbar 310 in the direction intersecting with the busbar 310. In this case, even in a state where the busbar 310 is secured, the core holding member 322 can be attached and removed. This eliminates the necessity to preliminarily pass the busbar 310 through the core holding member 322 prior to securing the busbar 310. Therefore, an excellent assembling property is provided.

The openings 311 to 313 or the protrusion of the busbar 310 may include the second opening 312. The core holding member 322 may be dividable into the plurality of parts 341 arranged in the opening direction of the second opening 312. The core holding member 322 may be configured to be removable in the direction intersecting with the busbar 310 in the case where the core holding member 322 is divided into the plurality of parts 341. At least one of the pluralities of the parts 341 may include the protrusion 345 fitting to the second opening 312 and positioned with respect to the second opening 312. In this case, fitting the protrusion 345 included in the core holding member 322 to the second opening 312 formed in the busbar 310 ensures positioning the magnetic core 321 without the fastening member. This provides the simplification of the structure and the improvement of the assembling property.

The core holding member 322 may be dividable into the plurality of parts 351 arranged in the direction along the busbar 310. The core holding member 322 may be configured to be removable in the direction intersecting with the busbar 310 in the case where the core holding member 322 is divided into the plurality of parts 351. In this case, the freedom of design is increased. For example, even in the case where the core holding member 322 is divided into the two parts 351 and 351, the core holding member 322 can be configured to restrain the magnetic core 321 from the inner peripheral side. The core holding member 322 also can be configured to restrain the magnetic core 321 from the inner peripheral side and the outer peripheral side.

The openings 311 to 313 or the protrusion of the busbar 310 may include the third opening 313. The core holding member 322 may be dividable into the plurality of parts 351 arranged in the direction along the busbar 310. The core holding member 322 may be configured to be removable in the direction intersecting with the busbar 310 in the case where the core holding member 322 is divided into the plurality of parts 351. The core holding member 322 may be secured to the busbar 310 and positioned with respect to the third opening 313 by the fastening member 358 inserted into the third opening 313. In this case, when the core holding member 322 is installed on the busbar 310, the above-described plurality of parts 351 are slid along the busbar 310. Then, it is difficult to fit the core holding member 322 itself to the busbar 310. In contrast to this, using the fastening member 358 ensures positioning and securing the core holding member 322 after installed to the busbar 310 with more certainty.

The core holding member 322 may be dividable into the two parts such that the two parts have a shape identical to one another and disposed in the point symmetry to one another viewing from the direction along the busbar 310 or the direction intersecting with the busbar 310. This reduces the number of the kinds of the part.

The core holding member 322 may restrain the magnetic core 321 from the outer peripheral side. This restrains the contact of the magnetic core 321 and the members on the peripheral area of the magnetic core 321 with more certainty.

The core holding member 322 may restrain the magnetic core 321 from the inner peripheral side. This restrains the contact of the magnetic core 321 and the busbar 310 with more certainty.

The core holding member 322 may include the separator 355 that is disposed on the inner peripheral side of the magnetic core 321 and configured to keep the plurality of busbars 310 apart from one another. This effectively uses the inner peripheral side of the core holding member 322 to ensure the electrical insulation between the busbars 310 with a simple structure.

The embodiment of the disclosure may be following first to thirteenth power conversion apparatuses and a first noise filter.

The first power conversion apparatus includes a busbar, a magnetic core disposed to surround the busbar, and a fixing member that supports the magnetic core and is secured to the busbar.

The second power conversion apparatus is the first power conversion apparatus where the busbar includes an opening or a protrusion formed therein and the fixing member is positioned with respect to the opening or the protrusion.

The third power conversion apparatus is the first or the second power conversion apparatus where the fixing member is fastened to a terminal for securing the busbar along with the busbar.

The fourth power conversion apparatus is the second power conversion apparatus where the opening or the protrusion of the busbar includes a first opening through which a fastening member for securing the busbar to a terminal passes, and the fixing member is secured to the terminal along with the busbar by the fastening member to be positioned with respect to the first opening.

The fifth power conversion apparatus is any one of the first to the fourth power conversion apparatuses where the fixing member is removable from the busbar in the direction intersecting with the busbar.

The sixth power conversion apparatus is the second power conversion apparatus where the opening or the protrusion of the busbar includes a second opening. The fixing member is dividable into a plurality of parts arranged in an opening direction of the second opening, and configured to be removable in the direction intersecting with the busbar when the fixing member is divided into the plurality of parts. At least one of the pluralities of the parts includes a protrusion fitting to the second opening and is positioned with respect to the second opening.

The seventh power conversion apparatus is the fifth power conversion apparatus where the fixing member is dividable into a plurality of parts arranged in the direction along the busbar. The fixing member is configured to be removable in the direction intersecting with the busbar when the fixing member is divided into the plurality of parts.

The eighth power conversion apparatus is the second power conversion apparatus where the opening or the protrusion of the busbar include a third opening. The fixing member is dividable into a plurality of parts arranged in a direction along the busbar, and configured to be removable in the direction intersecting with the busbar when the fixing member is divided into the plurality of parts. The fixing member is secured to the busbar by a fastening member inserted into the third opening to be positioned with respect to the third opening.

The ninth power conversion apparatus is any one of the fifth to the eighth power conversion apparatus where the fixing member has a shape identical to one another, and the fixing member is dividable into two parts disposed in a point symmetry to one another viewing from a direction along the busbar or the direction intersecting with the busbar.

The tenth power conversion apparatus is any one of the first to the ninth power conversion apparatus where the fixing member restrains the magnetic core from an outer peripheral side.

The eleventh power conversion apparatus is any one of the first to the tenth power conversion apparatus where the fixing member restrains the magnetic core from an inner peripheral side.

The twelfth power conversion apparatus is the eleventh power conversion apparatus where the fixing member is disposed on the inner peripheral side of the magnetic core and includes a separator to keep the plurality of busbars apart from one another.

The thirteenth power conversion apparatus is the first power conversion apparatus where the magnetic core includes a first magnetic core and a second magnetic core, the fixing member includes a first fixing member and a second fixing member respectively corresponding to the first magnetic core and the second magnetic core, the first fixing member is fastened to a terminal for securing the busbar along with the busbar, and the second fixing member is removable from the busbar in the direction intersecting with the busbar.

The first noise filter includes a magnetic core disposed to surround a busbar of a power conversion apparatus and a fixing member that supports the magnetic core and is secured to the busbar.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:
1. A power conversion apparatus comprising:
a busbar including an opening;
a magnetic core disposed to surround the busbar; and
a fixing member that supports the magnetic core and is secured to the busbar,
wherein the fixing member includes:

a fixing member opening positioned with respect to the opening of the busbar; or a fixing member protrusion engaging with the opening of the busbar to position the fixing member with respect to the busbar, and wherein the fixing member includes a separator that is disposed on an inner peripheral side of the magnetic core and configured to keep a plurality of the busbars apart from one another.

2. The power conversion apparatus according to claim 1, wherein the fixing member and the busbar are fastened to a terminal provided in the power conversion apparatus.

3. A power conversion apparatus comprising:

a busbar including an opening;

a magnetic core disposed to surround the busbar; and a fixing member that supports the magnetic core and is secured to the busbar, wherein the fixing member includes:

a fixing member opening positioned with respect to the opening of the busbar; or a fixing member protrusion engaging with the opening of the busbar to position the fixing member with respect to the busbar, wherein the opening of the busbar includes a first opening through which a fastening member for securing the busbar to a terminal passes, and wherein the fixing member is, by the fastening member, secured to the terminal along with the busbar and positioned with respect to the first opening.

4. The power conversion apparatus according to claim 1, wherein the fixing member is removable from the busbar in a direction intersecting with the busbar.

5. The power conversion apparatus according to claim 1, wherein the opening of the busbar includes a second opening, the fixing member is dividable into a plurality of parts arranged in an opening direction of the second opening, the fixing member is configured to be removable in a direction intersecting with the busbar in a case where the fixing member is divided into the plurality of parts, and at least one of the pluralities of the parts includes a protrusion fitting to the second opening and positioned with respect to the second opening.

6. A power conversion apparatus comprising:

a busbar including an opening;

a magnetic core disposed to surround the busbar; and a fixing member that supports the magnetic core and is secured to the busbar, wherein the fixing member includes:

a fixing member opening positioned with respect to the opening of the busbar; or a fixing member protrusion engaging with the opening of the busbar to position the fixing member with respect to the busbar, wherein the fixing member includes at least one stop comprising a hook configured to restrain the magnetic core from being removed from the fixing member, wherein the fixing member is removable from the busbar in a direction intersecting with the busbar, wherein the fixing member is dividable into a plurality of parts arranged in a direction along the busbar, and wherein the fixing member is configured to be removable in a direction intersecting with the busbar in a case where the fixing member is divided into the plurality of parts.

7. The power conversion apparatus according to claim 1, wherein the opening of the busbar includes a third opening, the fixing member is dividable into a plurality of parts arranged in a direction along the busbar, the fixing member is configured to be removable in a direction intersecting with the busbar in a case where the fixing member is divided into the plurality of parts, and the fixing member is, by a fastening member inserted into the third opening, secured to the busbar and positioned with respect to the third opening.

8. A power conversion apparatus comprising:

a busbar;

a magnetic core disposed to surround the busbar; and a fixing member that supports the magnetic core and is secured to the busbar, wherein the fixing member is removable from the busbar in a direction intersecting with the busbar, and the fixing member is dividable into two parts such that the two parts have a shape identical to one another and disposed in a point symmetry to one another viewing from the direction along the busbar or the direction intersecting with the busbar.

9. The power conversion apparatus according to claim 1, wherein the fixing member is dividable into two parts such that the two parts have a shape identical to one another and disposed in a point symmetry to one another viewing from the direction along the busbar or the direction intersecting with the busbar.

10. The power conversion apparatus according to claim 1, wherein the fixing member restrains the magnetic core from an outer peripheral side.

11. The power conversion apparatus according to claim 1, wherein the fixing member restrains the magnetic core from the inner peripheral side.

12. The power conversion apparatus according to claim 10, wherein the fixing member restrains the magnetic core from the inner peripheral side.

13. The power conversion apparatus according to claim 1, wherein the magnetic core includes a first magnetic core and a second magnetic core, the fixing member includes a first fixing member and a second fixing member respectively corresponding to the first magnetic core and the second magnetic core, the first fixing member and the busbar are fastened to a terminal provided in the power conversion apparatus, and the second fixing member is removable from the busbar in a direction intersecting with the busbar.

14. A noise filter comprising:

a magnetic core disposed to surround a busbar of a power conversion apparatus, and a fixing member that supports the magnetic core and is secured to the busbar, wherein the busbar includes an opening, and wherein the fixing member includes:

a fixing member opening positioned with respect to the opening of the busbar; or a fixing member protrusion engaging with the opening of the busbar to position the fixing member with respect to the busbar, and wherein the fixing member includes a separator that is disposed on an inner peripheral side of the magnetic core and configured to keep a plurality of the busbars apart from one another.

15. The noise filter according to claim 14, wherein the fixing member includes at least one stop comprising a hook configured to restrain the magnetic core from being removed from the fixing member.

16. The power conversion apparatus according to claim 1, wherein the fixing member includes at least one stop comprising a hook configured to restrain the magnetic core from being removed from the fixing member.

* * * * *